United States Patent
Chang et al.

(10) Patent No.: US 8,895,360 B2
(45) Date of Patent: Nov. 25, 2014

(54) INTEGRATED SEMICONDUCTOR DEVICE AND WAFER LEVEL METHOD OF FABRICATING THE SAME

(71) Applicant: Taiwan Semiconductor Manufacturing Company, Ltd., Hsin-Chu (TW)

(72) Inventors: Kuei-Sung Chang, Kaohsiung (TW); Chun-Wen Cheng, Zhubei (TW); Alex Kalnitsky, San Francisco, CA (US); Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/773,224

(22) Filed: Feb. 21, 2013

(65) Prior Publication Data

US 2014/0035158 A1  Feb. 6, 2014

Related U.S. Application Data

(60) Provisional application No. 61/677,902, filed on Jul. 31, 2012.

(51) Int. Cl.
*H01L 23/48* (2006.01)
*H01L 25/065* (2006.01)
*H01L 23/00* (2006.01)

(52) U.S. Cl.
CPC ..... *H01L 23/481* (2013.01); *H01L 2924/13091* (2013.01); *H01L 24/81* (2013.01); *H01L 2224/08145* (2013.01); *H01L 24/13* (2013.01); *H01L 24/80* (2013.01); *H01L 2224/05567* (2013.01); *H01L 24/92* (2013.01); *H01L 2224/81* (2013.01); *H01L 24/08* (2013.01); *H01L 24/16* (2013.01); *H01L 2224/13147* (2013.01); *H01L 2224/24011* (2013.01); *H01L 2224/821* (2013.01); *H01L 2224/24051* (2013.01); *H01L 2224/13022* (2013.01); *H01L 24/83* (2013.01); *H01L 2224/13124* (2013.01); *H01L 24/82* (2013.01); *H01L 2224/24145* (2013.01); *H01L 24/24* (2013.01); *H01L 25/0657* (2013.01); *H01L 2224/80896* (2013.01); *H01L 2224/24105* (2013.01); *H01L 2224/9202* (2013.01)
USPC .... 438/109; 257/774; 257/777; 257/E23.067; 257/E25.03

(58) Field of Classification Search
CPC ............................. H01L 23/481; H01L 24/83
USPC .................... 257/774, 777, E23.067, E25.03; 438/109
See application file for complete search history.

(56) References Cited

U.S. PATENT DOCUMENTS 8,546,188 B2 * 10/2013 Liu et al. ........................ 438/109
2006/0057836 A1 * 3/2006 Nagarajan et al. ............ 438/622

(Continued)

*Primary Examiner* — Allan R Wilson
(74) *Attorney, Agent, or Firm* — Haynes and Boone, LLP

(57) ABSTRACT

The present disclosure provides one embodiment of a stacked semiconductor device. The stacked semiconductor device includes a first substrate; a first bond pad over the first substrate; a second substrate including a second electrical device fabricated thereon; a second bond pad over the second electrical device over the second substrate, the second bond pad electrically connecting to the second electrical device; a second insulation layer over the second bond pad having a top surface, the second insulation layer being bonded toward the first bond pad of the first substrate; and a through-substrate-via ("TSV") extending from a surface opposite to the first bond pad through the first substrate and through the top surface of the second insulation layer to the second bond pad.

20 Claims, 9 Drawing Sheets

(56) References Cited

U.S. PATENT DOCUMENTS

| | | |
|---|---|---|
| 2007/0152313 A1* | 7/2007 | Periaman et al. ............. 257/686 |
| 2008/0142990 A1* | 6/2008 | Yu et al. ........................ 257/777 |
| 2010/0193954 A1* | 8/2010 | Liu et al. ....................... 257/751 |
| 2011/0102657 A1* | 5/2011 | Takahashi et al. ............ 348/308 |
| 2011/0233785 A1* | 9/2011 | Koester et al. ................ 257/773 |
| 2011/0248396 A1* | 10/2011 | Liu et al. ....................... 257/686 |
| 2012/0032348 A1* | 2/2012 | Yu et al. ........................ 257/777 |
| 2012/0112361 A1* | 5/2012 | Han et al. ...................... 257/774 |

* cited by examiner

INTEGRATED SEMICONDUCTOR DEVICE AND WAFER LEVEL METHOD OF FABRICATING THE SAME

PRIORITY

This patent claims the benefit of U.S. Patent Application Ser. No. 61/677,902 filed Jul. 31, 2012, entitled "INTEGRATED PASSIVE AND CMOS DEVICE AND WAFER LEVEL METHOD OF FABRICATING THE SAME," which is hereby incorporated by reference in its entirety.

BACKGROUND

Passive electrical devices, such as capacitors or inductors, are sometimes integrated with complementary metal-oxide-semiconductor ("CMOS") chips. Traditionally, when large capacitances or inductances are required, the use of large size passive devices is necessary. As a result, interconnecting such devices is only possible through external electrical paths, such as wire bonding. Moreover, when working with larger chip sizes, longer electrical paths are necessary.

Traditional passive device/CMOS integration presents a number of disadvantages. First, electrical parasitics created by longer electrical paths can deteriorate chip performance, especially after molding. Second, it is difficult to shrink the size of the system due to the pads required to wirebond the passive devices to the CMOS chip. Third, because the passive devices must be individually bonded to the CMOS chip, precision is decreased which further increases difficulty of system shrinkage. Fourth, precise assembly of multiple passive devices with a CMOS chip takes effort, which increases fabrication costs.

BRIEF DESCRIPTION OF THE DRAWINGS

The present disclosure is best understood from the following detailed description when read in conjunction with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
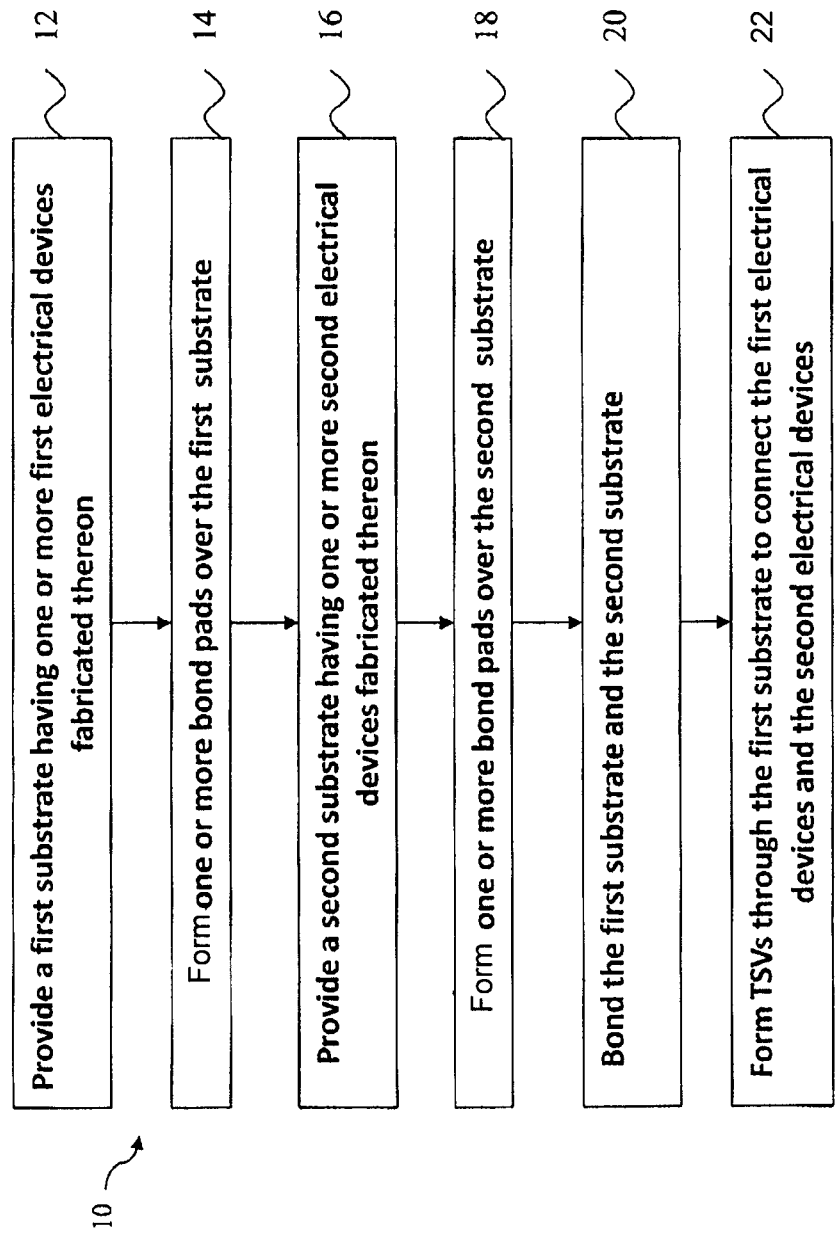
FIG. 1 is a flow chart of a method for fabricating a device according to an exemplary embodiment of the present invention.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flow chart illustrating steps in a wafer level method 10 for fabricating a device according to an exemplary embodiment of the present invention. The method 10 fabricates a stacked semiconductor device such as, for example, a complementary metal-oxide-semiconductor ("CMOS") device. At step 12, a first substrate is provided that includes one or more first electrical devices fabricated on a substrate. In the present embodiment, the substrate is a bulk silicon substrate. As would be understood by one ordinarily skilled in the art having the benefit of this disclosure, the substrate could be, for example, silicon or ceramic, and the electrical device (s) could be passive (e.g., capacitor, inductor, resistor, etc.) or active devices. The electrical devices may be fabricated on the substrate using a variety of micro-fabrication technologies, such as, for example, lithography, etching or film deposition. Moreover, in an alternative embodiment, there are no active devices present in the device substrate. However, in the alternative, the device substrate may include active devices, such as, for example, a diode or transistor.

At step 14, one or more bond pads are formed over the first substrate. At step 16, a second substrate having a second electrical device (e.g., a CMOS device) is provided. In the present embodiment, the second substrate is also a bulk silicon substrate, although other substrates can be used, as discussed above with reference to the first substrate. At step 18, one or more bond pads are formed over the second substrate. At step 20, the first and second substrates are then aligned and bonded to one another, thus reducing assembly effort. In this exemplary embodiment, the device substrate (i.e., first substrate) and CMOS device wafer (i.e., second substrate) are precisely aligned at <10 um, thus providing controllability of electrical parasitics that can result from chip interconnections. Also, in this exemplary embodiment, wafer bonding methods are conductive wafer bonding method such as, for example, fusion bonds, eutectic bonds, and/or hybrid bonds may be utilized to bond the substrate to the CMOS device. In another embodiment, the bonding methods include non-conductive wafer bonding. In furtherance of the embodiments, the bonding method in FIG. 2D uses a conductive wafer bonding and the bonding method in FIG. 3D may use a non-conductive wafer bonding or alternatively a conductive wafer bonding. However, those ordinarily skilled in the art having the benefit of this disclosure realize there are a variety of other bonding methods which could be utilized.

Thereafter, at step 22, one or more through-substrate-vias ("TSVs") are formed to connect the first and second electrical devices. Thus, as described herein, conductive wafer bonding and/or TSVs are utilized to interconnect the first and second device substrates. In embodiments utilizing the conductive wafer interface as the interconnect, Ge/Al, Al/Al, Cu/Cu or other bonding materials may be utilized. Moreover, the TSVs may be utilized to provide both internal and external connections for the chip.

FIGS. 2A-2D provide diagrammatic cross-sectional views of a device 100, in portion or entirety, at various stages of fabrication according to the exemplary wafer level method 10 of FIG. 1. Device 100 may include an integrated circuit device, specifically a CMOS device, integrated with a substrate having one or more passive devices disposed therein. The passive device(s) utilized in this embodiment are trench capacitors. However, those ordinarily skilled in the art having the benefit of this disclosure realize any variety or combination of other passive devices such as, for example, inductors or resistors, may be disposed therein also. In this exemplary embodiment, the CMOS and passive device(s) are interconnected using a conductive wafer bonding interface. FIGS. 2A-2D have been simplified for the sake of clarity to better understand the inventive concepts of the present disclosure. Additional features can be added in the device 100, and some of the features described below can be replaced or eliminated for additional embodiments of the device 100.

Figure 2A:
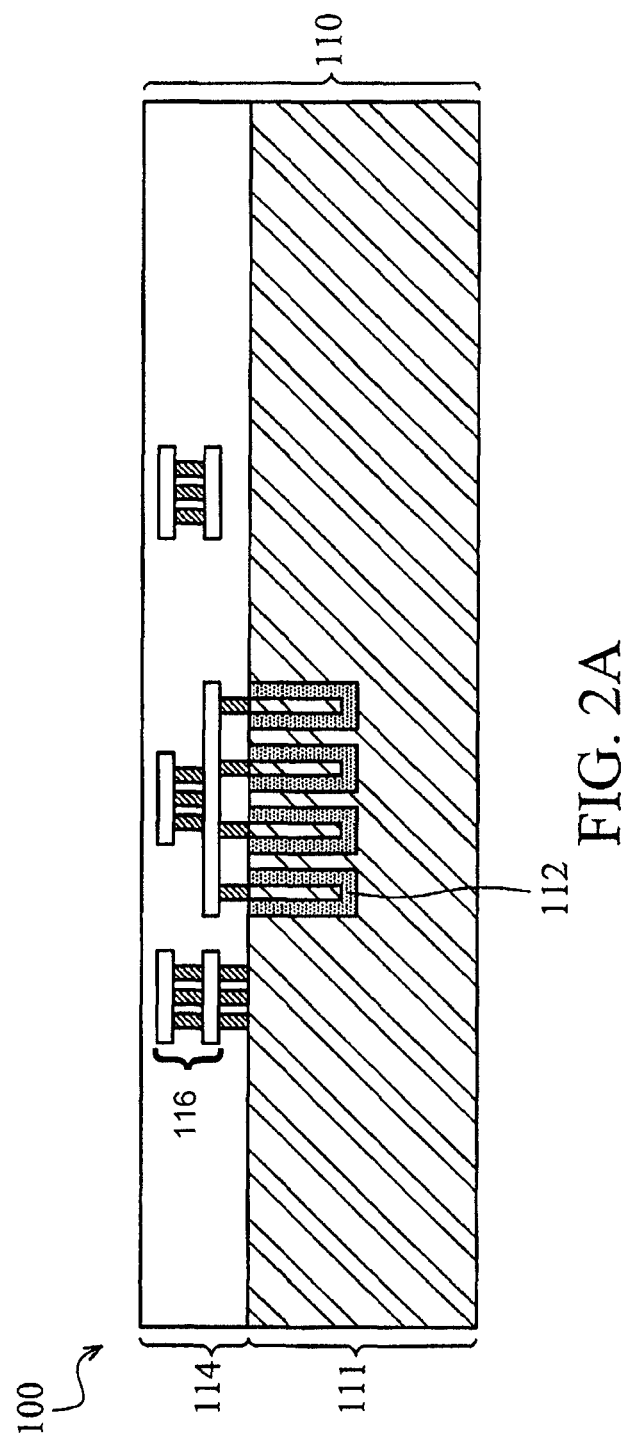
FIGS. 2A-2D are diagrammatic cross-sectional views of a device during various steps of the method of FIG. 1, according to an exemplary embodiment of the present invention.

Referring to FIG. 2A, device 100 includes a device substrate 110. In this exemplary embodiment, device substrate 110 includes a substrate 111 having a plurality of trench capacitors 112 designed and formed therein utilizing any suitable fabrication process. Substrate 111 is a semiconductor substrate, such as a silicon or ceramic substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Furthermore, substrate 110 may also be a semiconductor on insulator (SOI).

In the depicted embodiment, the substrate 111 may further include various layers that are not separately depicted and that combine to form various microelectronic elements that may include: transistors (for example, metal-oxide-semiconductor field-effect transistors (MOSFETs) including CMOS transistors, bipolar junction transistors (BJTs), high voltage transistors, high frequency transistors, p-channel and/or n-channel field-effect transistors (PFETs/NFETs), resistors, diodes, capacitors, inductors, fuses, other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 111 may also include various doped regions, isolation features, other features, or combinations thereof. Moreover, such microelectronic elements may interconnect to one another to form a portion of the substrate 110, such as a logic device, memory device (for example, a static random access memory (SRAM)), radio frequency (RF) device, input/output (I/O) device, system-on-chip (SoC) device, other suitable type of device, or combinations thereof.

Device substrate 110 includes an insulation layer 114 disposed over substrate 111. In this exemplary embodiment, insulation layer 114 is made of a material such as, for example, silicon oxide. However, those ordinarily skilled in the art having the benefit of this disclosure realize a variety of other insulators may be utilized. A plurality of conductive elements 116 are disposed within insulation layer 114. Conductive elements 116 comprise both horizontal and vertical interconnects, such as contacts and/or vias, such as conductive lines. Exemplary metals utilized in conductive elements 116 may include aluminum, aluminum/silicon/copper alloy, copper, titanium, titanium nitride, tantalum, tantalum nitride, tungsten, polysilicon, metal silicide, or combinations thereof. Conductive elements 116 may be formed by processes including physical vapor deposition (PVD), chemical vapor deposition (CVD), or combinations thereof.

Other manufacturing techniques to form the various conductive elements 116 may include photolithography processing and etching to pattern conductive materials to form the vertical and horizontal interconnects. Still other manufacturing processes may include thermal annealing to form metal silicide. The metal silicide used in conductive elements 116 may include nickel silicide, cobalt silicide, tungsten silicide, tantalum silicide, titanium silicide, platinum silicide, erbium silicide, palladium silicide, or combinations thereof. Alternatively, conductive elements 116 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that conductive elements 116 are not limited by the number, material, size, and/or dimension of those illustrated, and thus, may include any number, material, size, and/or dimension of conductive features depending on design requirements of the device 100.

Figure 2B:
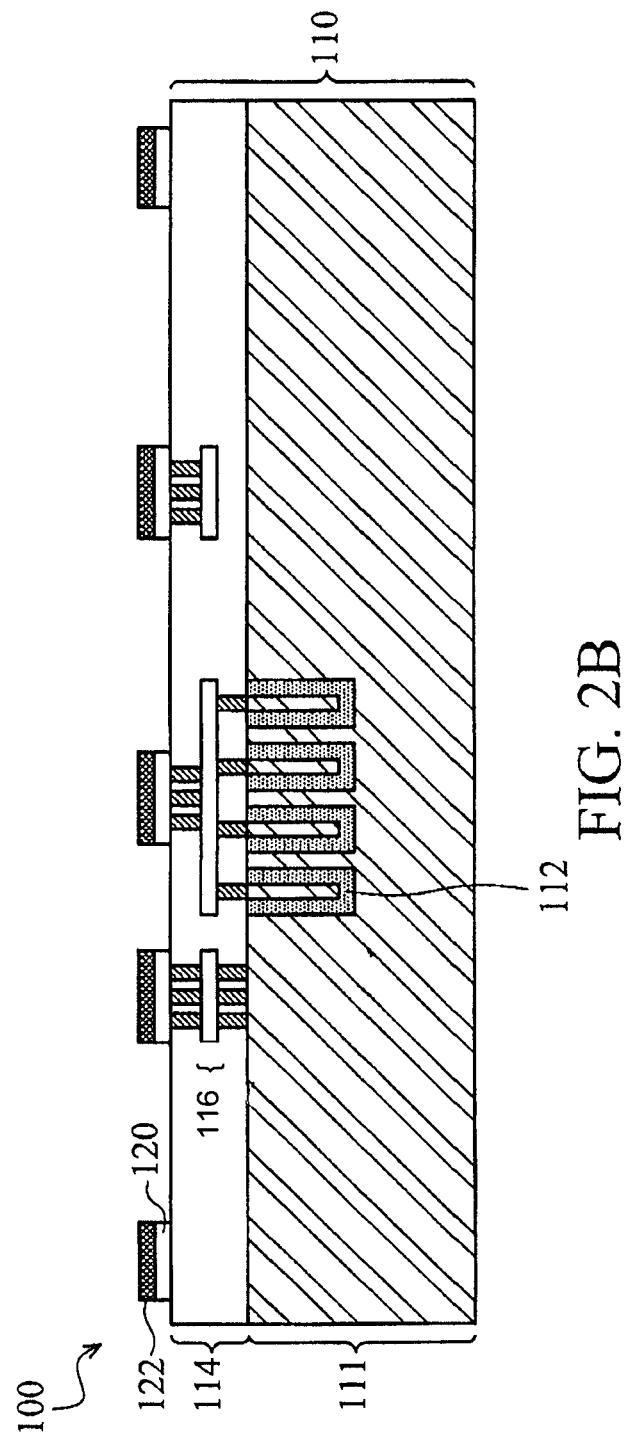

Referring to FIG. 2B, fabrication of the conductive wafer bond interface will now be described. Here, a CMOS metal layer 120 is formed over insulation 114. CMOS metal layer 120 is another interconnect and, thus, may be fabricated using those same process and materials discussed above in relation to conductive elements 116. Conductive bonding material 122 is disposed above CMOS metal layer 120. As understood in the art, Ge/Al, Al/Al, Cu/Cu or other bonding materials may be utilized as the bonding material. In addition, CMOS metal layer 120 and conducting bonding material 122 jointly form a bond pad.

Figure 2C:
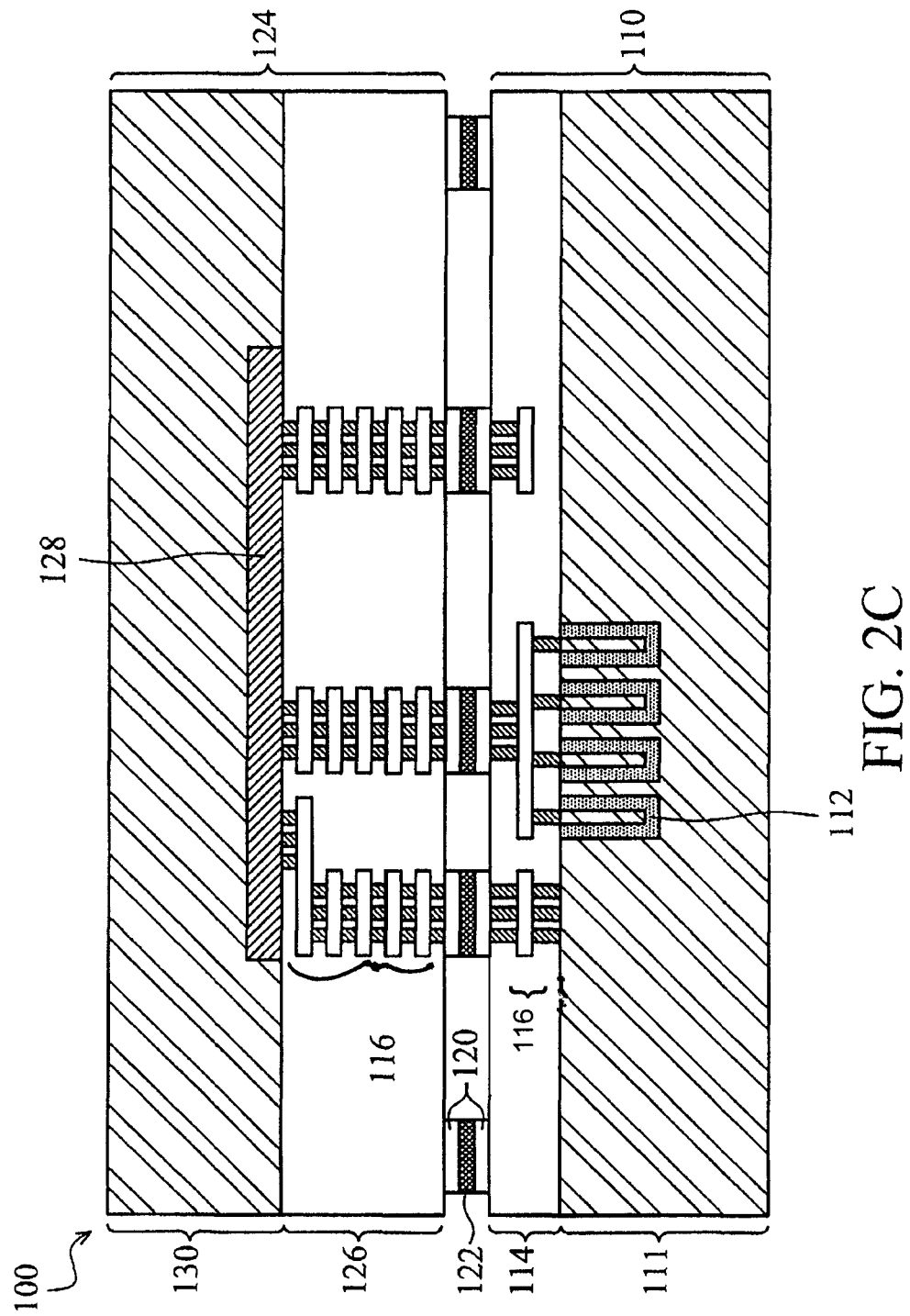

Referring now to FIG. 2C, at this stage in the fabrication process a CMOS device wafer 124 is bonded to device substrate 110 using conductive wafer bonding. In this exemplary embodiment, wafer bonding methods such as, for example, fusion bonds, eutectic bonds, and/or hybrid bonds may be utilized. However, those ordinarily skilled in the art having the benefit of this disclosure realize there are a variety of other bonding methods which could be utilized. As illustrated, CMOS device wafer 124 includes a CMOS 128 formed on substrate 130 using suitable CMOS processes. In order to achieve bonding, another CMOS metal layer 120 (i.e., bond pad) is formed on CMOS device wafer 124, whereby CMOS device wafer 124 and substrate 110 are bonded together. Conductive bonding material may also be applied to CMOS metal layer 120 of wafer 124 (thus also forming a bond pad), as would be understood by one ordinarily skilled in the art having the benefit of this disclosure.

CMOS device wafer 124 further includes an insulation layer 126 having conductive elements 116 disposed therein. In this exemplary embodiment, the insulation layer 126 is an oxide layer, such as silicon oxide. Alternatively or additionally, the insulating layer may include silicon nitride, silicon oxynitride, other suitable material, or combinations thereof. As previously described, conductive elements 116 include conductive materials, such as metal. For example, the conductive materials may include tungsten, titanium, aluminum, copper, alloys thereof, other suitable metals or alloys thereof, or combinations thereof.

Substrate 130 is a semiconductor substrate, such as a silicon substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Furthermore, substrate 130 may also be a semiconductor on insulator (SOI) and may also include various layers that are not separately depicted and that combine to form various microelectronic elements that may include: transistors (for example, metal-oxide-semiconductor field-effect transistors (MOSFETs) including CMOS transistors, bipolar junction transistors (BJTs), high voltage transistors, high frequency transistors, p-channel and/or n-channel field-effect transistors (PFETs/NFETs), resistors, diodes, capacitors, inductors, fuses, other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 130 may also include various doped regions, isolation features, other features, or combinations thereof. Moreover, such microelectronic elements may interconnect to one another to form a portion of the substrate 130, such as a logic device, memory device (for example, a static random access memory (SRAM)), radio frequency (RF) device, input/output (I/O) device, system-on-chip (SoC) device, other suitable type of device, or combinations thereof.

Figure 2D:
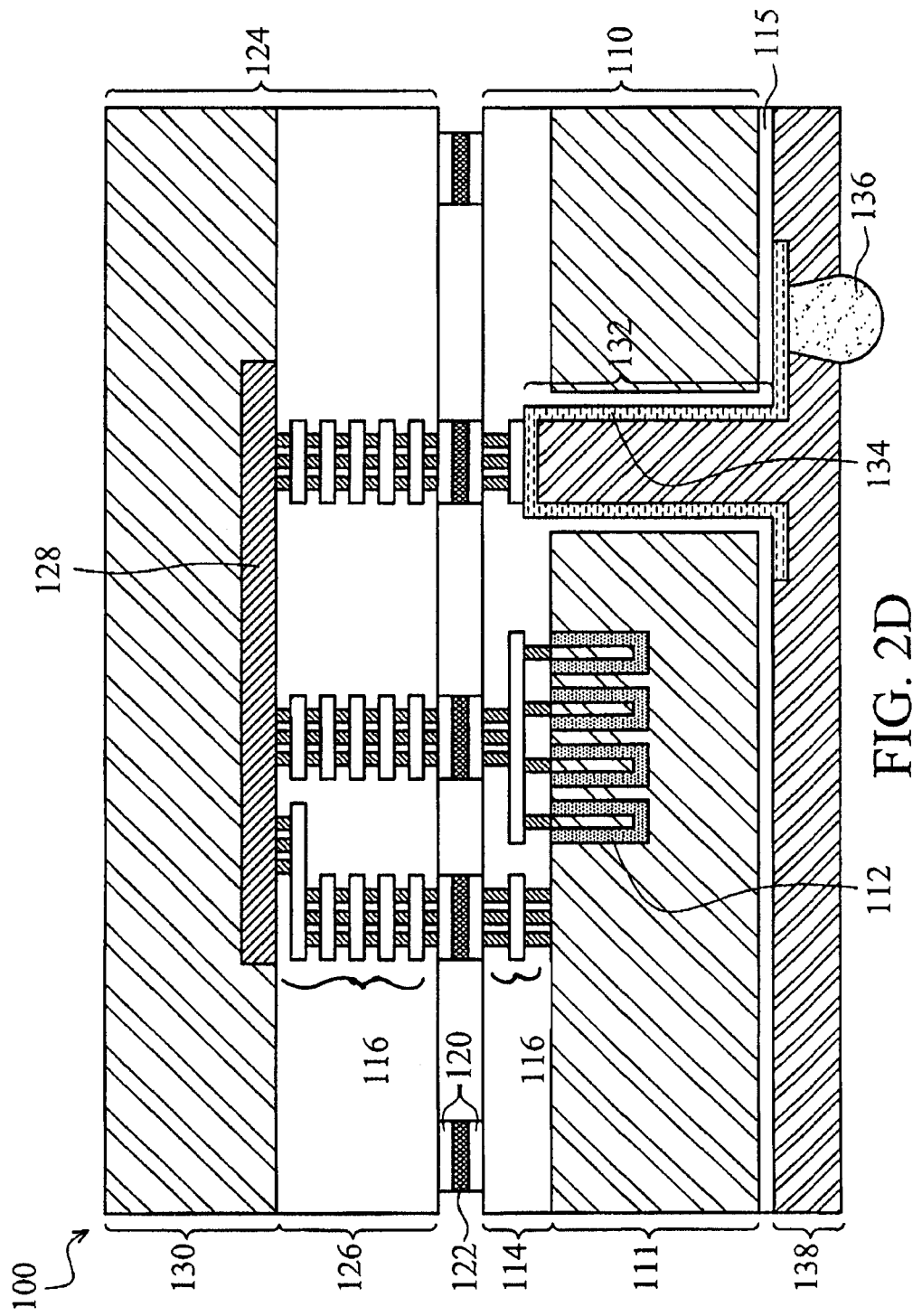

Referring to FIG. 2D, the completion of the fabrication of device 100 will now be described. As illustrated, after CMOS device wafer 124 is bonded to device substrate 110 using the conductive wafer bonding interface (i.e., the bonding pads 120,122), a TSV 132 is formed within substrate 111, extending from the bottom of substrate 111 up to the bottom of conductive element 116. As such, TSV 132 provides both internal and external electrical connections for device 100. The TSV 132 includes an insulation layer 115 formed along sidewalls of TSV 132 and beneath substrate 111, and may be comprised of the same material as that of insulation layer 114 previously described. The TSV 132 also includes a metal trace 134 over the insulation layer 115. The metal trace 134 is then bonded to a solder ball or a conductive bump 136 and extends underneath substrate 111 to connect conductive elements 116 to provide the external electrical connection. In at least one embodiment, the metal trace 134 completely fills the hole of the TSV 132 and over a portion of a top surface of the insulation layer 115. In certain embodiments, the metal trace 134 is formed along the sidewalls of TSV 132, not completely filling the hole of the TSV 132, and over a portion of a top surface of the insulation layer 115. Thereafter, passivation material 138 is provided underneath substrate 111 and over TSV 132 to prevent corrosion. In this exemplary embodiment, passivation material 138 is, for example, an oxide or nitride, or polymers such as, for example, epoxy, polyimide, parylene, etc. Although only one TSV 132 is illustrated herein, those ordinarily skilled in the art having the benefit of this disclosure realize multiple TSVs may be utilized. Accordingly, device 100 has been integrated with multiple passive devices, thereby providing a device to minimize and stabilize undesirable electrical parasitics at a low assembly cost.

FIGS. 3A-3D are diagrammatic cross-sectional views of another exemplary device 200, in portion or entirety, at various stages of fabrication according to the method 10 of FIG. 1. The embodiment of FIGS. 3A-3D is similar in many respects to the embodiment of FIGS. 2A-2D. The most notable distinction, however, is that the embodiment of FIGS. 3A-3D utilizes integration by TSVs instead of integration by conductive wafer bonding, as previously described in relation to FIGS. 2A-2D. Nevertheless, the embodiments are similar in that, for example, the device 200 also includes a first and second device wafer. Accordingly, similar features in FIGS. 3A-3D are identified by the same reference numerals for clarity and simplicity. FIGS. 3A-3D have been simplified for the sake of clarity to better understand the inventive concepts of the present disclosure. Additional features can be added in the device 200, and some of the features described below can be replaced or eliminated in other embodiments of the device 200.

Device 200 includes an integrated circuit device such as, for example, a CMOS device, integrated with a substrate having one or more passive or active electrical devices disposed therein. The passive device(s) utilized in this embodiment are trench capacitors. However, those ordinarily skilled in the art having the benefit of this disclosure realize any variety or combination of active or other passive devices such as, for example, inductors or resistors, may be disposed therein also. In this exemplary embodiment, the CMOS and passive device(s) are integrated using one or more TSVs.

Figure 3A:
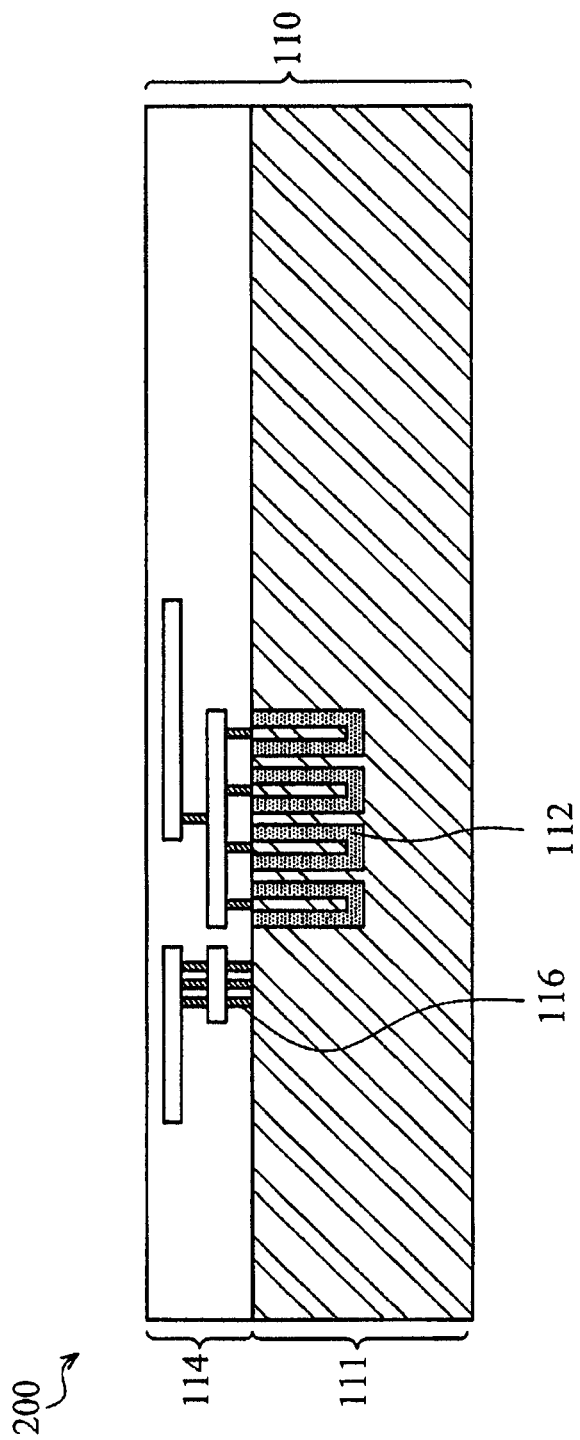
FIGS. 3A-3D are diagrammatic cross-sectional views of an alternative device during various steps of the method of FIG. 1, according to another exemplary embodiment of the present invention.

Referring to FIG. 3A, device 200 includes a device substrate 110. In this exemplary embodiment, device substrate 110 includes a substrate 111 having a plurality of trench capacitors 112 designed and formed therein utilizing any suitable fabrication process. Substrate 111 is a semiconductor substrate, such as a silicon or ceramic substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Furthermore, substrate 110 may also be a semiconductor on insulator (SOI).

In the depicted embodiment, the substrate 111 may also include various layers that are not separately depicted and that combine to form various microelectronic elements that may include: transistors (for example, MOSFETs including CMOS transistors, BJTs, high voltage transistors, high frequency transistors, PFETs/NFETs), resistors, diodes, capacitors, inductors, fuses, other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 111 may also include various doped regions, isolation features, other features, or combinations thereof. Moreover, such microelectronic elements may interconnect to one another to form a portion of the substrate 110, such as a logic device, memory device (for example, a SRAM), RF device, I/O device, SoC device, other suitable type of device, or combinations thereof.

Device substrate 110 includes an insulation layer 114 disposed over substrate 111. In this exemplary embodiment, insulation layer 114 is made of a material such as, for example, silicon oxide. However, those ordinarily skilled in the art having the benefit of this disclosure realize a variety of other insulators may be utilized. A plurality of conductive elements 116 are disposed within insulation layer 114. Conductive elements 116 comprise both horizontal and vertical interconnects, such as contacts and/or vias, such as conductive lines. Exemplary metals utilized in conductive elements 116 may include aluminum, aluminum/silicon/copper alloy, copper, titanium, titanium nitride, tantalum, tantalum nitride, tungsten, polysilicon, metal silicide, or combinations thereof. Conductive elements 116 may be formed by processes including physical vapor deposition (PVD), chemical vapor deposition (CVD), or combinations thereof.

Other manufacturing techniques to form the conductive elements 116 may include photolithography processing and etching to pattern conductive materials to form the vertical and horizontal connects. Still other manufacturing processes may include thermal annealing to form metal silicide. The metal silicide used in conductive elements 116 may include nickel silicide, cobalt silicide, tungsten silicide, tantalum silicide, titanium silicide, platinum silicide, erbium silicide, palladium silicide, or combinations thereof. Alternatively, conductive elements 116 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that conductive elements 116 are not limited by the number, material, size, and/or dimension of those illustrated, and thus, may include any number, material, size, and/or dimension of conductive features depending on design requirements of the device 200.

Figure 3B:
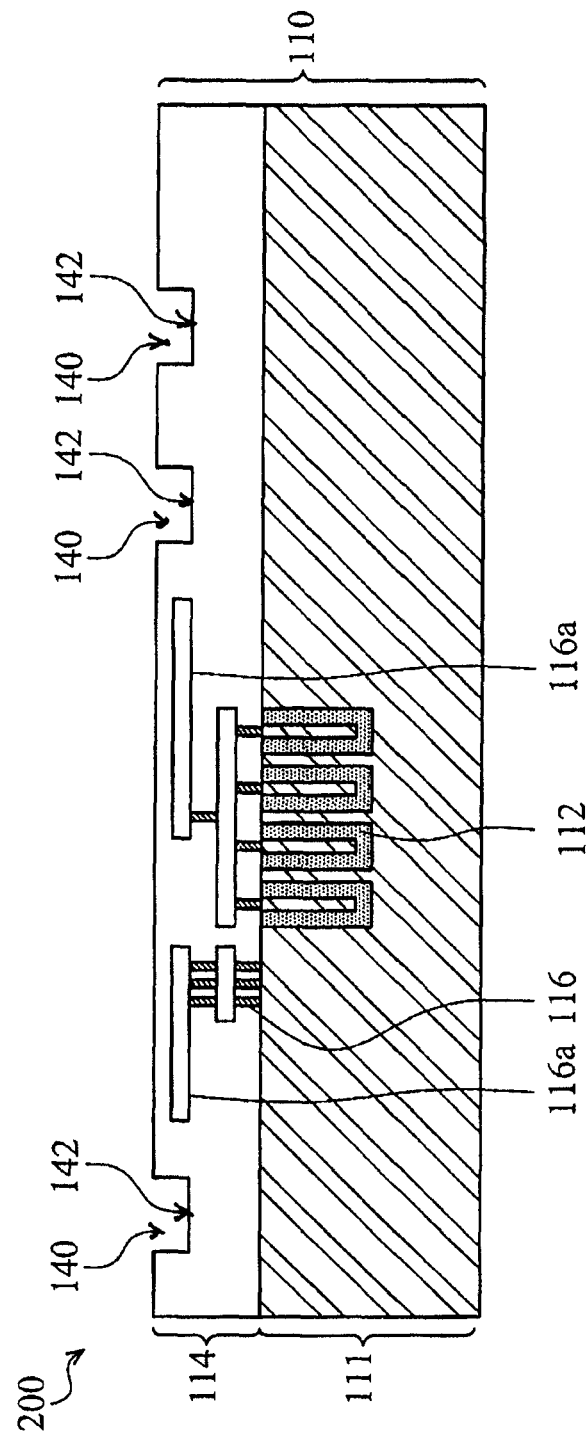

Referring to FIG. 3B, a recess 140, or opening, is fabricated on the upper surface of insulation layer 114. In this exemplary embodiment, a lower surface 142 of the recess 140 extends down to a lower surface 116a of the uppermost conductive elements 116. The recess 140 is formed by a suitable process, such as lithography process and etching.

Figure 3C:
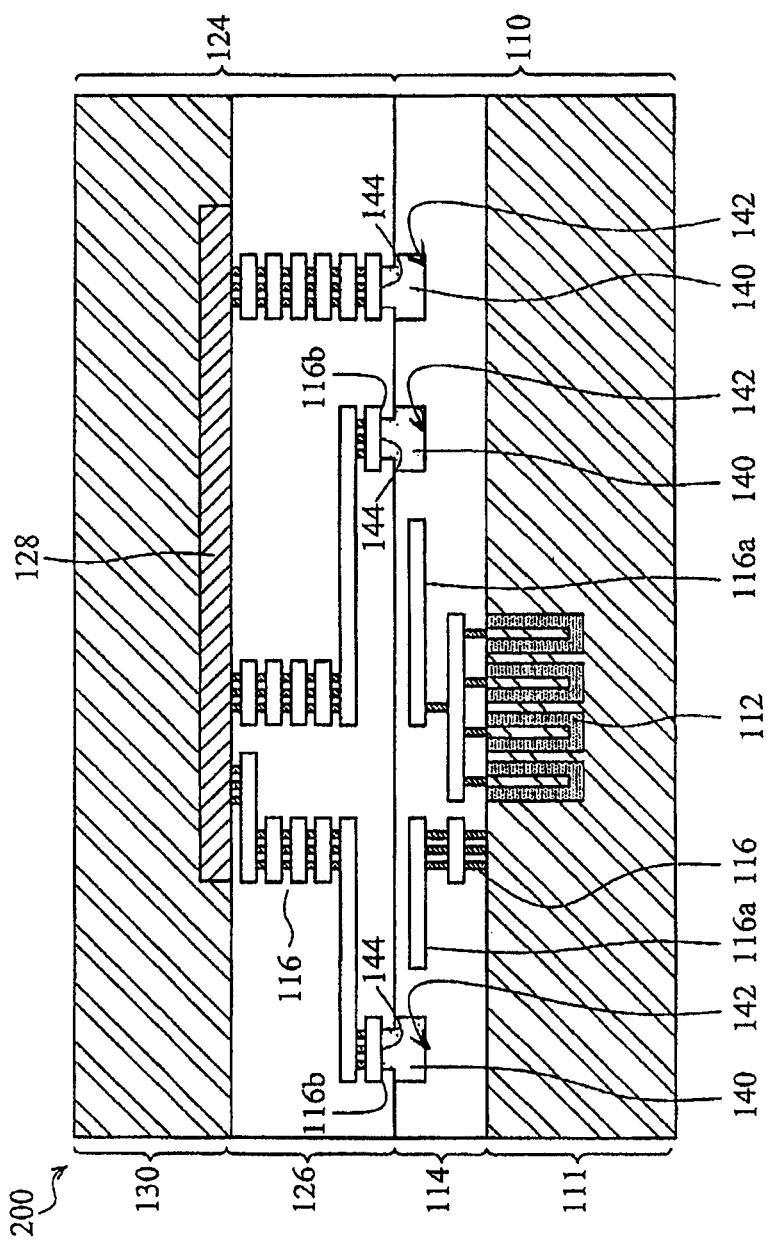

Referring now to FIG. 3C, at this stage in the fabrication process a CMOS device wafer 124 is integrated with device substrate 110 using TSVs. As illustrated, CMOS device wafer 124 includes a CMOS 128 formed on a substrate 130 utilizing suitable CMOS processes. In order to allow integration of CMOS wafer 124 and device substrate 110, another recess 140, or opening, is fabricated on the lower surface of insulation layer 126 to match those oxide patterns fabricated on device substrate 110. Thus, CMOS device wafer 124 also includes an insulation layer 126 having conductive elements 116 disposed therein. Also, note that the upper surface 144 of recess 140 of CMOS wafer 124 exposes the lowermost surface 116b of conductive elements 116, thereby exposing conductive elements 116 to form a bond pad.

In this exemplary embodiment, insulation layer 126 is an oxide layer, such as a silicon oxide layer. Alternatively or additionally, the insulating layer may include silicon nitride, silicon oxynitride, other suitable material, or combinations thereof. Conductive elements 116 include conductive materials, such as metal, as previously described. For example, the conductive materials may include tungsten, titanium, aluminum, copper, alloys thereof, other suitable metals or alloys thereof, or combinations thereof.

Details of the materials and fabrication methods of the substrate 130 can be found in the text associated with the substrate 130 in the device 100 and are not repeated here. In this exemplary embodiment, CMOS device wafer 124 is bonded to device substrate 110 using, for example, fusion bonds, eutectic bonds, and/or hybrid bonds. However, those ordinarily skilled in the art having the benefit of this disclosure realize there are a variety of other bonding methods which could be utilized.

Figure 3D:
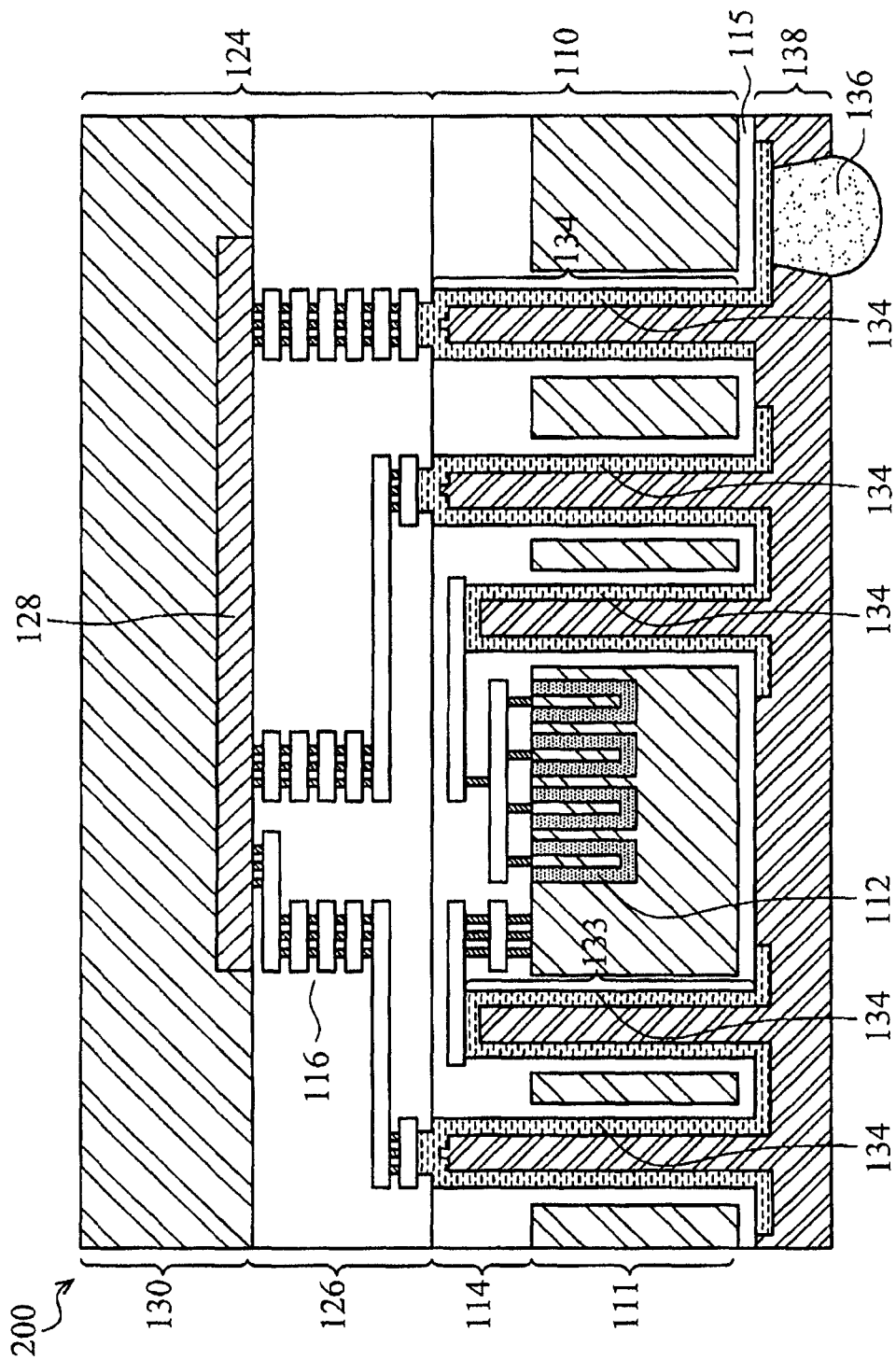

Referring to FIG. 3D, the completion of the fabrication of device 200 will now be described. As illustrated, after alignment of recesses 140 of device substrate 110 and CMOS device wafer 124, CMOS device wafer 124 is bonded to device substrate 110, and one or more TSVs 133 are formed within substrate 111 in order to provide both internal and external electrical connections for device 200. In this exemplary embodiment, TSVs 133 extend from the bottom of substrate 111, though insulation layer 114, up to bond pad 116b (e.g., lowermost surface 116b of conductive elements 116) of CMOS device wafer 124, while TSVs 133 extend from the bottom of substrate 111 up to one or more bond pads 116a (e.g., lower surface 116a of the uppermost conductive elements 116) to device substrate 110.

The TSVs 133 include an insulation layer 115 formed along sidewalls of TSVs 133 and beneath substrate 111, and may be comprised of the same material as that of insulation layer 114 previously described. The TSVs 133 also include a metal trace 134 formed over insulation layer 115. The metal trace 134 extends underneath substrate 111 to connect conductive elements 116 in CMOS device wafer 124 and is bonded to a solder ball or a conductive bump 136 to provide external electrical connection. Metal trace 134 may be formed using, for example, a seed layer deposition or copper plating process. In at least one embodiment, the metal trace 134 completely fills the hole of the TSV 133 and over a portion of a top surface of the insulation layer 115. In certain embodiments, the metal trace 134 is formed along the sidewalls of TSV 133, not completely filling the hole of the TSV 133, and over a portion of a top surface of the insulation layer 115. Thereafter, passivation material 138 is provided underneath substrate 111 and along TSVs 133 to prevent corrosion. In this exemplary embodiment, passivation material 138 may be, for example, an oxide or nitride, or polymers, such as, for example, epoxy, polyimide, parylene, etc. Although multiple TSVs are illustrated herein, those ordinarily skilled in the art having the benefit of this disclosure realize that a single TSV may also be utilized. Accordingly, device 200 has been integrated with multiple passive devices, thereby providing a device to minimize and stabilize undesirable electrical parasitics at a low assembly cost.

Exemplary embodiments of the present invention may be integrated with a variety of bonding techniques. For example, in an exemplary methodology of the present invention, a die to wafer bonding technique may be utilized in which a plurality of semiconductor dies are fabricated, and then bonded to a single wafer having a plurality of circuits fabricated thereon. Another exemplary methodology utilizes a wafer to wafer bonding technique, in which a plurality of circuits are fabricated on a first and second substrate, and then bonded to one another as described herein. In addition, after bonding, the stacked devices may undergo wafer level packaging and dicing as desired. Accordingly, those ordinarily skilled in the art having the benefit of this disclosure realize there are a variety of such techniques which may be integrated into the present invention.

The present disclosure thus provides a device that integrates one or more electrical devices with a CMOS device to minimize and stabilize electrical parasitics and provide for a more compact system integration, all at a lower cost than traditional integration techniques. As described herein, the electrical device(s) are made on a device substrate that is aligned with and bonded to another device substrate, which reduces assembly effort. Due to the precise alignment of the first and second substrates (for example, <10 um), electrical parasitics resulting from interconnections can be well controlled. Since no additional wire bond paths are necessary, the present disclosure further provides more compact system integration.

Moreover, in the exemplary embodiments described herein, the device substrates include one or more passive devices on the same wafer. However, this should not be interpreted as limiting the disclosed device substrates to such embodiments. For example, active devices may also be utilized. Also, it is contemplated that the disclosed device substrates may comprise multiple device substrates on multiple wafers stacked atop one another. Moreover, the interconnection between the device substrates may be a conductive wafer bonding interface and/or one or more TSVs.

Furthermore, the present disclosure also provides for many other embodiments of the integrated device. Different embodiments may have different advantages, and no particular advantage, such as those described above, is necessarily required of any embodiment. For example, the present invention is not to be limited to TSVs, but may also encompass other vertical electrical connections passing through a die. Also, more than one CMOS device may be integrated into the devices described herein.

In an exemplary embodiment, a method to fabricate a stacked semiconductor device comprises providing a first substrate having a first electrical device fabricated thereon, providing a first bond pad on the first substrate, providing a second substrate having a second electrical device fabricated thereon, providing a second bond pad on the second substrate, bonding the first and second substrates together, and providing a through-substrate-via ("TSV") through the first substrate to interconnect the first and second electrical devices, thus electrically coupling the stacked semiconductor device.

In an alternative embodiment, providing the first substrate further comprises providing a plurality of discrete circuits on the first substrate and providing a first bond pad on each of the plurality of discrete circuits on the first substrate, wherein providing the second substrate further comprises providing a plurality semiconductor dies as the second substrate, each of the plurality of semiconductor dies having an electrical device fabricated thereon and providing a second bond pad on each of the plurality of semiconductor dies, wherein bonding the first and second substrates further comprises bonding each of the plurality of semiconductor dies to a corresponding discrete circuit of the first substrate through the first and second bond pads.

In yet another alternate embodiment, providing the first substrate further comprises providing a plurality of discrete circuits on the first substrate and providing a first bond pad on each of the plurality of discrete circuits on the first substrate, wherein providing the second substrate further comprises providing a plurality of discrete circuits on the second substrate and providing a second bond pad on each of the plurality of discrete circuits on the second substrate, wherein bonding the first and second substrates further comprises bonding each of the discrete circuits of the first substrate to a corresponding discrete circuit of the second substrate through the first and second bond pads.

In another alternative embodiment, providing the first substrate further comprises providing a plurality of discrete circuits on the first substrate, providing a first bond pad on each of the plurality of discrete circuits on the first substrate, providing a first insulation layer over the first bond pad and providing a first opening on the first insulation layer, wherein providing the second substrate further comprises providing a plurality semiconductor dies as the second substrate, each of the plurality of semiconductor dies having an electrical device fabricated thereon, providing a second bond pad on each of the plurality of semiconductor dies, providing a second insulation layer over the second bond pad and providing a second opening on the second insulation layer, wherein bonding the first and second substrates further comprises extending the TSV through the first substrate to electrically couple to the second bond pad.

In yet another alternative embodiment, providing the first substrate further comprises providing a plurality of discrete circuits on the first substrate, providing a first bond pad on each of the plurality of discrete circuits on the first substrate, providing a first insulation layer over the first bond pad and providing a first opening on the first insulation layer, wherein providing the second substrate further comprises providing a plurality of discrete circuits on the second substrate, providing a second bond pad on each of the plurality of discrete circuits on the second substrate, providing a second insulation layer over the second bond pad and providing a second opening on the second insulation layer, wherein bonding the first and second substrates further comprises extending the TSV through the first substrate to electrically couple to the second bond pad.

In another exemplary embodiment, a method is provided that comprises integrating a stacked semiconductor device into an electrical system, the device comprising a first substrate having a first electrical device fabricated thereon, a first bond pad on the first substrate, a second substrate having a second electrical device fabricated thereon, a second bond pad on the second substrate, wherein the first and second substrates are bonded together, and a through-substrate-via ("TSV") extending through the first substrate to interconnect the first and second substrates, thus electrically coupling the stacked semiconductor device.

Yet another exemplary embodiment of the present invention provides a stacked semiconductor device comprising a first substrate having a first electrical device fabricated thereon, a first bond pad on the first substrate, a second substrate having a second electrical device fabricated thereon, a second bond pad on the second substrate, wherein the first and second substrates are bonded together, and a through-substrate-via ("TSV") extending through the first substrate to interconnect the first and second substrates, thus electrically coupling the stacked semiconductor device.

In another exemplary embodiment, a stacked semiconductor device includes a first substrate having one or more passive electrical devices fabricated thereon, with no active devices fabricated thereon. Example passive electrical devices include capacitors, coils, resistors, and inductors. The device also includes a second substrate having a complementary metal-oxide-semiconductor ("CMOS") device. An interconnection is provided between the passive electrical device and the CMOS device.

In yet another exemplary embodiment, a method includes providing a first substrate having a passive electrical device fabricated thereon and providing a second substrate having a complementary metal-oxide-semiconductor ("CMOS") device. The method further includes providing an interconnection to connect the passive electrical device and the CMOS device.

In another embodiment, a method includes integrating a stacked semiconductor device into an electrical system. The device includes first and second substrates, and an interconnection therebetween. The first substrate includes a passive electrical device fabricated thereon, and the second substrate includes a complementary metal-oxide-semiconductor ("CMOS") device. In some embodiments, the interconnection is a conductive wafer boding interface or through-silicon-via ("TSV").

In another embodiment, a stacked semiconductor device includes a first substrate having one or more passive electrical devices fabricated thereon, with no active devices fabricated thereon. In yet another embodiment, a method comprises providing a first substrate having a passive electrical device fabricated thereon, wherein there are no active devices thereon, providing a second substrate having a complementary metal-oxide-semiconductor ("CMOS") device and providing an interconnection to connect the passive electrical device and the CMOS device.

Another exemplary methodology of the present invention provides a method to fabricate a stacked semiconductor device. The method includes providing a first substrate having a first electrical device and a first bond pad over the first electrical device, the first electrical device being electrically connected to the first bond pad; providing a second substrate having a second electrical device and a second bond pad over the second electrical device, the second electrical device being electrically connected to the second bond pad; bonding the first and second substrates together, wherein the first and second bond pads are electrically interconnected; and after the bonding, forming a through-substrate-via ("TSV") from a surface of the first substrate opposite the first bond pad, through the first substrate, and to the first bond pad.

Yet another exemplary methodology of the present invention provides a method to fabricate a stacked semiconductor device. The method includes providing a first substrate having a first electrical device and a first bond pad over the first electrical device; depositing a first insulation layer over the first bond pad over the first substrate; forming a first recess in the first insulation layer, the first recess having a bottom surface lower than a bottom surface of the first bond pad; providing a second substrate having a second electrical device and a second bond pad over the second electrical device; depositing a second insulation layer over the second bond pad over the second substrate; forming a second recess in the second insulation layer to expose a portion of the second bond pad; bonding the first insulation layer to the second insulation layer with the first recess and the second recess aligned; and after the bonding, forming a through-substrate-via ("TSV") from a surface of the first substrate opposite the first bond pad, through the first substrate to the first recess.

An exemplary embodiment of the present invention provides a stacked semiconductor device. The stacked semiconductor device includes a first substrate; a first bond pad over the first substrate; a second substrate including a second electrical device fabricated thereon; a second bond pad over the second electrical device over the second substrate, the second bond pad electrically connecting to the second electrical device; a second insulation layer over the second bond pad having a top surface, the second insulation layer being bonded toward the first bond pad of the first substrate; and a through-substrate-via ("TSV") extending from a surface opposite to the first bond pad through the first substrate and through the top surface of the second insulation layer to the second bond pad.

The foregoing outlines features of several embodiments so that those ordinarily skilled in the art may better understand the aspects of the present disclosure. Those skilled persons should appreciate that they may readily use the present disclosure as a basis for designing or modifying other processes and structures for carrying out the same purposes and/or achieving the same advantages of the embodiments introduced herein. Those ordinarily skilled in the art should also realize that such equivalent constructions do not depart from the spirit and scope of the present disclosure, and that they may make various changes, substitutions, and alterations herein without departing from the spirit and scope of the present disclosure. Therefore, it should be understood that the invention is not intended to be limited to the particular forms disclosed. Rather, the intention is to cover all modifications, equivalents, and alternatives falling within the spirit and scope of the invention as defined by the appended claims.

What is claimed is:

1. A method to fabricate a stacked semiconductor device, the method comprising:
   providing a first substrate having a first electrical device and a first bond pad over the first electrical device, the first electrical device being electrically connected to the first bond pad;
   providing a second substrate having a second electrical device and a second bond pad over the second electrical device, the second electrical device being electrically connected to the second bond pad;
   bonding the first and second substrates together, wherein the first and second bond pads are electrically interconnected; and
   after the bonding, forming a through-substrate-via ("TSV") from a surface of the first substrate opposite the first bond pad, through the first substrate, and to the first bond pad, wherein forming the TSV includes forming a trench extending from the surface of the first substrate opposite the first bond pad, through the first substrate, and to the first bond pad and depositing a metal material within the trench after bonding the first and second substrates together.

2. The method of claim 1, further comprising dicing the stacked semiconductor device to provide a plurality of stacked semiconductor devices.

3. The method of claim 1, wherein forming the TSV further comprises:
   forming an insulation layer along the TSV; and
   forming a metal trace over the insulation layer.

4. The method of claim 1, wherein the TSV contacts the first bond pad of the first substrate.

5. The method of claim 1, wherein providing the first substrate further comprises:
   providing a plurality of discrete dies on the first substrate; and
   forming the first bond pad over each of the plurality of discrete dies on the first substrate, wherein providing the second substrate further comprises:
      providing a plurality semiconductor dies on the second substrate, each of the plurality of semiconductor dies having the second electrical device fabricated thereon; and
      forming the second bond pad over each of the plurality of semiconductor dies,
   wherein bonding the first and second substrates further comprises bonding each of the plurality of semiconductor dies on the second substrate to a corresponding discrete die on the first substrate through the first and second bond pads.

6. The method of claim 5, further comprising dicing through the first substrate to separate a plurality of stacked dies which comprise at least one die from the first substrate and at least another die from the second substrate.

7. The method of claim 1, further comprises:
   providing a plurality of discrete dies on the first substrate, each die having the first electrical device;
   forming the first bond pad on each of the plurality of discrete dies on the first substrate,
   providing a single die on the second substrate, the single die having the second electrical device and the second bond pad over the second electrical device; and bonding the single die of the second substrate to at least one of the plurality of dies on the first substrate through the first and second bond pads.

8. The method of claim 1, further comprising dicing through the first substrate to separate a plurality of stacked dies which comprise a single die from the second substrate and at least one die from the first substrate.

9. The method of claim 1, further comprises:
providing a plurality of discrete dies on the first substrate;
forming the first bond pad on each of the plurality of discrete dies on the first substrate;
depositing a first insulation layer over the first bond pad;
forming a first opening on the first insulation layer;
providing a plurality semiconductor dies on the second substrate, each of the plurality of semiconductor dies having the second electrical device fabricated thereon;
forming the second bond pad on each of the plurality of semiconductor dies;
depositing a second insulation layer over the second bond pad; and
forming a second opening on the second insulation layer to expose a portion of the second bond pad,
wherein bonding the first and second substrates further comprises bonding the first and second substrates through the first insulation layer and the second insulation layer.

10. The method of claim 9, wherein the TSV contacts the second bond pad.

11. The method of claim 9, wherein bonding the first and second substrates further comprises aligning the first and second openings.

12. The method of claim 9, wherein forming the TSV further comprises forming a metal trace that extends through the first substrate and contacts the second bond pad.

13. The method of claim 1, wherein bonding the first and second substrates together includes aligning a first recess formed in a first material layer disposed over the first substrate with a second recess formed in a second material layer disposed over the second substrate, and
wherein the first TSV extends to the first recess.

14. A method to fabricate a stacked semiconductor device, the method comprising:
providing a first substrate having a first electrical device and a first bond pad over the first electrical device;
depositing a first insulation layer over the first bond pad over the first substrate;
forming a first recess in the first insulation layer, the first recess having a bottom surface lower than a bottom surface of the first bond pad;
providing a second substrate having a second electrical device and a second bond pad over the second electrical device;
depositing a second insulation layer over the second bond pad over the second substrate;
forming a second recess in the second insulation layer to expose a portion of the second bond pad;
bonding the first insulation layer to the second insulation layer with the first recess and the second recess aligned; and
after the bonding, forming a through-substrate-via ("TSV") from a surface of the first substrate opposite the first bond pad, through the first substrate to the first recess.

15. The method of claim 14, further comprising forming an insulation layer along sidewalls of the TSV.

16. The method of claim 14, further comprising forming a metal trace in the TSV and contacting the second bond pad.

17. The method of claim 16, further comprising forming a conductive bump on a portion of the metal trace over the first substrate.

18. The method of claim 14, further comprising dicing the stacked semiconductor device to provides a plurality of subsets of stacked semiconductor devices.

19. A method to fabricate a stacked semiconductor device, the method comprising:
providing a first substrate having a first electrical device and a first bond pad over the first electrical device, the first electrical device being electrically connected to the first bond pad;
providing a second substrate having a second electrical device and a second bond pad over the second electrical device, the second electrical device being electrically connected to the second bond pad;
bonding the first and second substrates together; and
after the bonding, forming a through-substrate-via ("TSV") from a surface of the first substrate opposite the first bond pad, through the first substrate, and to the first bond pad before bonding the first and second substrates together:
depositing a first insulation layer over the first bond pad over the first substrate;
forming a first recess in the first insulation layer, the first recess having a bottom surface lower than a bottom surface of the first bond pad;
depositing a second insulation layer over the second bond pad over the second substrate; and
forming a second recess in the second insulation layer to expose a portion of the second bond pad,
wherein the bonding the first and second substrates together results in the first recess and the second recess being substantially aligned.

20. The method of claim 19, wherein the first and second bond pads are electrically interconnected as a result of the bonding.

* * * * *